US006968306B1

(12) United States Patent
Alpert et al.

(10) Patent No.: US 6,968,306 B1
(45) Date of Patent: Nov. 22, 2005

(54) METHOD AND SYSTEM FOR DETERMINING AN INTERCONNECT DELAY UTILIZING AN EFFECTIVE CAPACITANCE METRIC (ECM) SIGNAL DELAY MODEL

(75) Inventors: Charles Jay Alpert, Austin, TX (US); Anirudh Devgan, Austin, TX (US); Chandramouli V. Kashyap, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 692 days.

(21) Appl. No.: 09/668,320

(22) Filed: Sep. 22, 2000

(51) Int. Cl.[7] .............................................. G06F 17/50
(52) U.S. Cl. .............................. 703/19; 703/2; 703/13; 716/2; 716/6
(58) Field of Search ............................... 703/2, 13, 19; 716/2, 6

(56) References Cited

U.S. PATENT DOCUMENTS 6,347,393 B1 * 2/2002 Alpert et al. .................. 716/2

OTHER PUBLICATIONS

Curtis L. Ratzlaff, Satyamurthy Pullela and Lawerence T. Pillage, "Modeling the RC-Interconnect Effects in a Hierarchical Timing Analyzer", IEEE 1992 Custom Integrated Circuits Conference, pp. 15.6.1-15.6.4.☐☐*
Andrew B. Kahng and Sudhakar Muddu, "Two-pole Analysis of Interconnection Trees", 1994 IEEE, pp. 105-110.☐☐*
Charles J. Aplert, Anirudh Devgan and Stephen T. Quay, "Buffer Insertion with Accurate Gate and Interconnect Delay Computation", DAC '99, pp. 479-484☐☐.*
Charles J. Alpert, Anirudh Devgan and Stephen T. Quay, "Buffer Insertion for Noise and Delay Optimization", IEEE tranactions on Computer-Aided Design of Integrated Circuits and Systems, vol. 18, No. 11, Nov. 1999, pp. 1633-1645☐☐.*
Jessica Qian, Satyamurthy Pullela and Lawrence Pillage, "Modeling the "Effective Capacitance" for the RC Interconnect of CMOS Gates", IEEE transactions on Computer-Aided Design of Integrated Circuits and Systems, vol. 13, No. 12, Dec. 1994, pp. 1526-1535.*
B. Tutuianu, F. Dartu, and L. Pileggi; "An Explicit RC-Circuit Delay Approximation Based on the First Three Moments of the Impulse Response"; *IEEE/ACM Design Automation Conference*; 1996; pp. 611-616;Las Vegas, NV, USA.

(Continued)

*Primary Examiner*—Jean R. Homere
*Assistant Examiner*—Herng-der Day
(74) *Attorney, Agent, or Firm*—Casimer K. Salys; Dillon & Yudell LLP

(57) ABSTRACT

A method for determining an interconnect delay at a node in an interconnect having a plurality of nodes. The method includes performing a bottom-up tree traversal to compute the first three admittance moments for each of the nodes in the interconnect. The computed admittance moments are utilized, in an advantageous embodiment, to compute a pi-model of the downstream load. Next, the equivalent effective capacitance value $C_{eff}$ is computed utilizing the components of the computed pi-model and the Elmore delay at the node under evaluation. In an advantageous embodiment, $C_{eff}$ is characterized by:

$$C_{eff} = C_{fj}(1 - e^{-T/\tau dj})$$

where $C_{fj}$ is the far-end capacitance of the pi-model at the node, T is the Elmore delay at the node and $\tau dj$ is the resistance of the pi-model ($R_{dj}$) multiplied by $C_{fj}$. The interconnect delay at the node is then determined utilizing an effective capacitance metric (ECM) delay model.

14 Claims, 4 Drawing Sheets

OTHER PUBLICATIONS

P.R. O'Brien, and T.L. Savarino; "Modeling the Driving-Point Characteristic of Resistive Interconnect for Accurate Delay Estimation"; *IEEE*, 1989; pp. 512-515.

J. Qian, S. Pullela, and L. Pillage; "Modeling the 'Effective Capacitance' for the RC Interconnect of CMOS Gates"; *IEEE Transaction on Computer-Aided Design of Integrated Circuits and Systems*, 1994, pp. 1526-1535, vol. 13, No. 12.

R. Kay, and L. Pileggi; "PRIMO: Probability Interpretation of Moments for Delay Calculation"; *Carnegie Mellon University, Dept. of ECE, Pittsburgh PA.*, pp. 1-20.

L.T. Pillage, and R.A. Rohrer; "Asymptotic Waveform Evaluation for Timing Analysis"; *IEEE Transaction on Computer-Aided Design*, 1990, pp. 352-366, vol. 9, No. 4.

A.B. Kahng, and S. Muddu; "An Analytical Delay Model for RLC Interconnects"; *IEEE Transaction on Computer-Aided Design of Integrated Circuits and Systems*; 1997, pp. 1507-1514, vol. 16, No. 12.

C.J. Alpert, A. Devgan, and C. Kashyap; "a Two Moment RC Delay Metric for Performance Optimization"; 2000.

W.C. Elmore; "The Transient Response of Damped Linear Networks with Particular Regard to Wideband Amplifiers"; *University of California, Los Alamos Scientific Laboratory, Santa Fe, New Mexico*; 1948, pp. 55-63, vol. 19, Jan. 1948.

L. Pileggi; "Timing Metrics for Physical Design of Deep Submicron Technologies"; Department of Electrical and Computer Engineering, Carnegie Mellon University, Monterey, CA, 1998, pp. 28-33.

J. Rubinstein, P. Penfield, Jr., and M.A. Horowitz; "Signal Delay in RC Tree Networks"; *IEEE*, 1983, pp. 202-210.

R. Gupta, B. Krauter, B. Tutuianu, J. Willis and L.T. Pileggi; "The Elmore Delay as a Bound for RC Trees with Generalized Input Signals"; *The University of Texas at Austin, Department of Electricical and Computer Engineering, Austin, Texas; 32$^{nd}$ Design Automation Conference*, 1995, pp. 364-369.

T. Lin, E. Acar, and L. Pileggi; "H-GAMMA: An RC Delay Metric Based on a Gamma Distribution Approximation of the Homogeneous Response"; pp. 1-8.

* cited by examiner $$\hat{y}_{1j} = y_{1j} + C_j; \quad \hat{y}_{2j} = y_{2j} - R_j (y_{1j})^2$$

$$\hat{y}_{3j} = y_{3j} - 2R_j (y_{1j})(y_{2j}) + R^2_j (y_{1j})^3$$

METHOD AND SYSTEM FOR DETERMINING AN INTERCONNECT DELAY UTILIZING AN EFFECTIVE CAPACITANCE METRIC (ECM) SIGNAL DELAY MODEL

BACKGROUND OF THE INVENTION

1. Technical Field

The present invention relates in general to semiconductor design automation systems, more particularly to the simulation of integrated circuit designs of such systems, and more particularly to the accurate determination of net (wiring) performance for such integrated circuit designs.

2. Description of the Related Art

Development of a working integrated circuit chip is a process that involves creating a design specification, creating the logical design of the chip (typically in schematic form), validating the design, re-designing as necessary, fabricating the chip and testing the chip. Costs tend to be "end-loaded," i.e., greater towards the end of the process than towards the beginning. The earlier in this process that a design error is detected, the earlier it can be corrected, saving a great deal of cost over a late-detected error. As a result, increasingly sophisticated steps are being taken to validate the design of a new chip, as early in the design process as possible.

Design validation requires thorough examination of the integrated circuit design and expected functional characteristics, taking into account a number of different factors, such as logical correctness of the design, timing factors (including net delay performance, effects of parasitic capacitances, etc.). Among these factors, net performance (specifically, net delay) is one of the most important. Many timing-related problems have been discovered in chips whose designs appear to be "logically" correct, at least on paper. This is because it is difficult for the designer to anticipate such delay contributors as wiring delays, i.e., net delays and the cumulative effects of distributed resistances and capacitances on the chips, especially from a post-layout point of view. The accuracy of delay determination affects not only the chip performance, but whether a chip meets its original design specification.

Virtually all integrated circuit designers today use semiconductor design automation systems which facilitate the capture, simulation, layout, and verification of integrated circuit designs. With the advance of semiconductor process technology, integrated circuits are becoming increasingly fast, and the once relatively small delays caused by interconnections, i.e., wiring, on a chip are becoming a more dominant factor in integrated circuit performance. As a result, the ability to accurately model and calculate wiring delays is becoming a crucial requirement for any semiconductor design automation system. These wiring delays, i.e., the time required for a critical threshold voltage at a receiving node to be crossed after the application of a driving signal at a driving node, are known as "net delays."

One of the by-products of an integrated circuit design on a semiconductor design automation system is a "net-list" which contains a complete description of all of the devices, e.g., transistors, resistors, etc., required and how they are connected. The connections are described in the form of "nets" (short for "networks") or descriptions of the point-to-point wiring connections between components. A single net may connect to many components. Any chip design will have a great number of nets. The net-list includes a list of net interconnections, thus the name "net-list".

From any driving point to any receiving point on a net, there is an associated delay. This time is due to a complicated combination of parasitic capacitances, wiring resistances, wire lengths, etc. Some nets have multiple drivers, e.g., a number of open-drain or tri-state drivers, or loops, e.g., clock rings, making their (accurate) analysis particularly complicated. The delay for a net is determined by modeling the net and analyzing the delay according to the model. One of the most serious problems in delay calculation (determination) is that accurate models tend to complicate delay calculations, resulting in expensive delays in the design cycle while computation-intensive net delays are being calculated. As a result, most prior-art net delay calculation techniques compromise on the accuracy (faithfulness to reality) of the model of the net in order to decrease the amount of calculation time required. Unfortunately, in doing so most such techniques sacrifice enough accuracy that the results of delay calculation are only very rough approximations of actual chip performance. As a result, many chips, particularly those with complicated timing relationships between signals, have subtle timing-related problems when they are built. The designs of such chips must then be altered, re-simulated, etc., and a new chip must be fabricated. This process is extremely costly.

Despite it being more than fifty (50) years old, the Elmore delay metric is widely employed in conventional Physical design tools. The popularity of the Elmore delay model is not surprising considering that it is, firstly, a fairly accurate measure of the true delay at far-end nodes, i.e., nodes far from the driving source. Secondly, it is expressible as a closed-from expression involving only the resistors and capacitors of the circuit under evaluation. Thirdly, it is a provable upper bound on the true delay for all inputs and finally, it is additive, i.e., the delay from node A to node C of a path passing through node B is the sum of delays from nodes A to B and from nodes B to C. Additivity offers the advantage of decoupling optimization problems into sub-problems, allowing optimal algorithms, e.g., for buffer insertion and wiresizing. However, the only attribute (and arguably the most important) that the Elmore delay lacks is consistent accuracy at all nodes. The Elmore delay can be inaccurate by orders of magnitude, especially for near-end, i.e., nodes close to the driving source.

Consequently, several other delay metrics based on higher-order moments have been proposed, see e.g., A B. Kahng and S. Muddu, "Two-pole Analysis of Interconnection trees," Proceeding IEEE Multi-Chip Module Conference, Santa Cruz, February 1995, pp. 105–110 and A. B. Kahng and S. Muddu, "A General Methodology for Responses and Delay Computations in VLSI Interconnects," UCLA CS Dept. TR-940015, 1994. While these approaches are typically more accurate than Elmore and simpler than truly actuate methods, see e.g., L. T. Pillage and R. A. Rohrer, "Asymptotic Waveform Evaluation for Timing Analysis," IEEE TCAD, 9(4), 352–366, 1990, some of the simplicity of the Elmore delay is lost. All of these metrics use multiple moments of the transfer function, which makes them non-additive.

Accordingly, what is needed in the art is an improved signal delay metric that mitigates the above-discussed limitations in the prior art.

SUMMARY OF THE INVENTION

It is therefore an object of the invention to provide an improved signal delay metric.

It is another object of the invention to provide a method for computing a signal delay at a node within an interconnect having a number of nodes.

To achieve the foregoing objects, and in accordance with the invention as embodied and broadly described herein, a method for determining an interconnect delay at a node in an interconnect having a plurality of nodes is disclosed. The method includes performing a bottom-up tree traversal to compute the first three admittance moments for each of the nodes in the interconnect. The computed admittance moments are utilized, in an advantageous embodiment, to compute a pi-model of the downstream load. Next, the equivalent effective capacitance value $C_{eff}$ is computed utilizing the components of the computed pi-model and the Elmore delay at the node under evaluation. In an advantageous embodiment, $C_{eff}$ is characterized by:

$$C_{eff} = C_{fj}(1 - e^{-T/\tau dj})$$

where $C_{fj}$ is the far-end capacitance of the pi-model at the node, T is the Elmore delay at the node and $\tau dj$ is the resistance of the pi-model ($R_{dj}$) multiplied by $C_{fj}$. The interconnect delay at the node ($ECM_j$) is then determined utilizing an effective capacitance metric (ECM) delay model characterized by:

$$ECM_j = ECM_{p(j)} + R_j(C_j + C_{nj} + C_{eff})$$

where $ECM_{p(j)}$ is the computed ECM delay at the node immediately preceding the node under evaluation, $R_j$ is the resistance between the node under evaluation and the preceding node, $C_j$ is the capacitance to ground at the node under evaluation and $C_{nj}$ is the near-end capacitance of the pi-model at the node under evaluation.

Assume a RC tree with nodes $\{v_o, \ldots, V_N\}$ where $v_o$ is the source. Let $C_j$ be the capacitance at node $v_j$ for $0 < i \leq N$, and let $R_{ki}$ be the total resistance of the portion of the unique path from $v_o$ to $v_i$ that overlaps with the unique path from $v_o$ to $V_k$. The Elmore delay to node $v_i$ is given by the formula:

$$ED_i = \sum_{k=1}^{N} R_{ki} C_k \qquad (3)$$

From the formula, one can see that two tree traversals are sufficient to compute the Elmore delay.

The present invention discloses a method utilizing a novel signal delay model for determining a signal delay at an interconnect node. The Effective Capacitance Metric (ECM) delay model disclosed by the present invention, unlike conventional methodologies discussed previously that have increased accuracies than the Elmore delay model, takes a different approach in that it does not utilize the circuit impulse response moments; simplifying the delay computational methodology. Instead, the downstream capacitance of a node in a resistive capacitive (RC) tree is modeled by an effective capacitance that, unlike the Elmore delay model, takes into account the resistive shielding of the downstream interconnect increasing the accuracy of the estimation of the delay. The present invention then utilizes this effective capacitance in the conventional Elmore formula to estimate delays. As a result, the delay metric of the present invention has the same form, i.e., simplicity and additivity, as the Elmore formula and can be computed using a bottom-up traversal followed by a top-down tree traversal.

The foregoing description has outlined, rather broadly, preferred and alternative features of the present invention so that those skilled in the art may better understand the detailed description of the invention that follows. Additional features of the invention will be described hereinafter that form the subject matter of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1A:
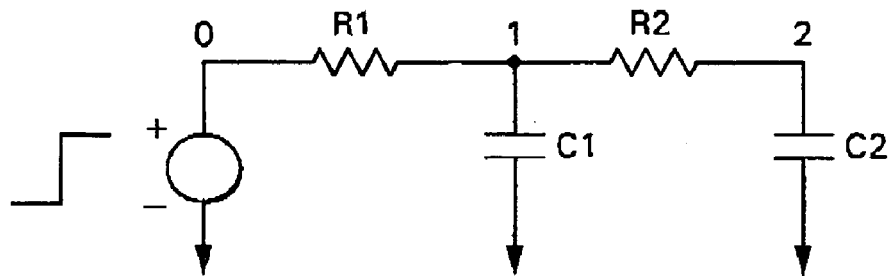
FIG. 1A illustrates an exemplary two-segment resistive capacitive (RC) circuit.

The intuition underlying the delay metric model disclosed by the present invention can be explained with the aid of an exemplary two-segment resistive capacitive (RC) circuit illustrated in FIG. 1A. The Elmore delay from node 0 to 1 is given by:

$$ED_1 = R_1 (C_1 + C_2) \qquad (1)$$

The relative inaccuracy of the Elmore delay increases as $R_2$ increases relative to $R_1$. In the limiting case when $R_2 = \infty$, the true delay is independent of $R_2$ and is given by 0.69 $(R_1 C_1)$. In contrast, the Elmore delay continues to depend on the value of $C_2$. This simple example shows that the Elmore delay does not take resistive shielding of $C_2$ by $R_2$ into account, resulting in large scale inaccuracies of delays of near-end nodes. If instead, suppose we estimate delay by:

$$D_1 = R_1(C_1 + kC_2) \qquad (2)$$

where $0 \leq k \leq 1$ is a parameter that captures resistive shielding. In the limiting case, $k=0$ when $R_2 = \infty$ and $k=1$ when $R_2 = 0$. Note that $kC_2$ can be interpreted as the "effective capacitance" seen at node 1. This idea is similar in spirit to the notion of effective capacitance used in gate level timing analysis. Of course, the accuracy and simplicity of the delay metric completely depends on the computation of k. The present invention presents one such procedure.

Assume a RC tree with nodes $\{v_o, \ldots, V_N\}$ where $v_o$ is the source. Let $C_i$ be the capacitance at node $v_1$ for $0<i \leq N$, and let $R_{ki}$ be the total resistance of the portion of the unique path from $v_o$ to $v_i$ that overlaps with the unique path from $v_o$ to $V_k$. The Elmore delay to node $v_i$ is given by the formula:

$$ED_i = \sum_{k=1}^{N} R_{ki} C_k \quad (3)$$

From the formula, one can see that two tree traversals are sufficient to compute the Elmore delay.

The Elmore delay is the first moment $m_1$ of the impulse response. Additional moments $m_2, m_3, \ldots$ can be used to derive more accuracy. Asymptotic waveform evaluation (AWE) takes the first 2q moments to match to q poles and q residues of the transfer function. This system of 2q equations must then be solved and the four moments $m_0, m_1, m_2, m_3$ are sufficient to derive reasonable accuracy. In this case, AWE essentially reduces to a 2-pole approximation. Once the poles and residues are computed to construct the time domain formula, iterative techniques such as Newton-Raphson method are used to get the 50% delay point. While this approach is considerably faster than traditional SPICE-like simulations, it is still much more expensive than a delay metric.

Tutuianu et al., "Explicit RC-Circuit Delay Approximation Based on the First Three Moments of the Impulse Response," IEEE/ACM DAC, 1996, pp. 611–616, teaches a closed-form approximation for estimating delay for step inputs. More recently, Kay and Pileggi, "PRIMO: Probability Interpretation of Moments for Delay Calculations," IEEE/ACM design Automation Conference, 1998, pp. 463468, proposed PRIMO that fits the moments of the impulse response to probability density functions. First, the parameters to the probability density function must be computed from the moments, and then a single table lookup operation is all that is required to produce the delay. Lin et al., "h-gamma: An RC Delay Metric Based on a Gamma Distribution Approximation to the Homogeneous Response," IEEE/ACM ICCAD, pp. 19–25, improved upon PRIMO with the h-gamma a metric. H-gamma avoids time-shifting the distribution functions and matching moments to the circuit's homogeneous response. However, for fast evaluation, a 2-D table needs to be carefully constructed.

In contrast, the delay metric of the present invention takes a different approach in that it does not utilize the circuit moments. Instead, the downstream capacitance of a node in the RC tree is modeled by an effective capacitance that takes into account the resistive shielding of the downstream interconnect. The present invention then utilizes this effective capacitance in the conventional Elmore formula to estimate delays. As a result, the delay metric of the present invention has the same form, i.e., simplicity and additivity, as the Elmore formula and can be computed using a bottom-up followed by a top-down tree traversal.

The notation described below in Table 1 is to facilitate the following discussion on the estimation of an interconnect delay utilizing the Effective Capacitance Metric (ECM) delay model disclosed by the present invention.

TABLE 1

Summary of notation

| Symbol | Description |
|---|---|
| p(j) | Predecessor of node j |
| $R_j$ | Resistance between nodes j and p(j) |
| $C_j$ | Capacitance to ground at node j |
| $C_{dj}$ | Total downstream capacitance beyond node j |
| $C_{nj}$ | Near end capacitance of pi-model at node j |
| $C_{fj}$ | Far end capacitance of pi-model at node j |
| $R_{dj}$ | Resistance of pi-model at node j |
| $ED_j$ | Elmore delay at node j |
| $ECM_j$ | Effective Capacitance Metric delay at node j |

Assuming that a given RC tree has capacitance to ground from every node, that there are no floating capacitances and a resistor connects every pair of nodes. The Elmore delay in Equation (3) can be expressed recursively as:

$$ED_j = ED_{p(j)} + R_j(C_j + C_{dj}) \quad (4)$$

where $$C_{dj} = \sum_{k \in s(j)} C_k \quad (5)$$

and s(j) is the set of all nodes downstream from node j. Since the Elmore delay pessimistically estimates delay by ignoring waveshape information, the response can be viewed as a step signal applied at the time instant given by the Elmore delay. In other words, if the Elmore delay at node j has already been computed, the delay to a node downstream from j can be computed by applying a step signal at the time instant $ED_j$ to the subtree rooted at node j. It should be noted that in the computation of $ED_j$, the capacitance downstream beyond j is modeled by the sum of all downstream capacitances.

Figure 1B:
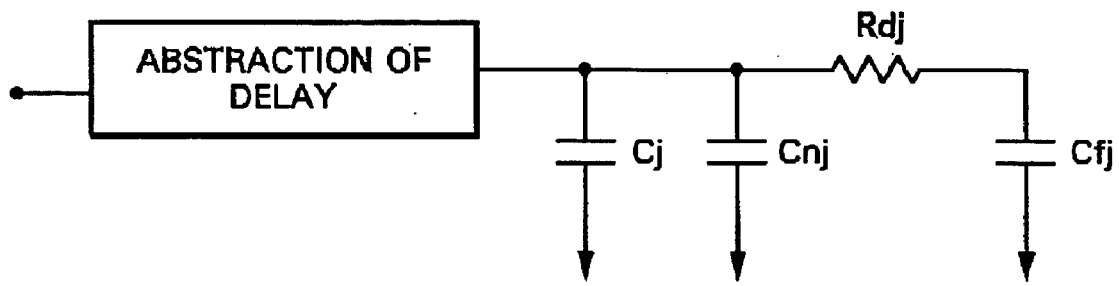
FIG. 1B illustrates modeling a circuit downstream of a node utilizing a pi-model.

The ECM delay model of the present invention, instead of modeling the downstream capacitance by a single value $C_{dj}$, represents the downstream capacitances from node j under evaluation with an equivalent effective capacitance, determined utilizing a pi-model as depicted in FIG. 1B, to capture resistive shielding. It should be rely apparent to those skilled in the art that the determination of the equivalent effective capacitance is not limited to one particular modeling scheme, in other embodiments, a tee-model may also be advantageously utilized. To compute the pi-model, the input admittance Y(s) of the circuit downstream of j is expanded in a Taylor series about s=0 as follows:

$$Y_j(s) = y_1 s + y_2 s^2 + y_3 s^3 + \quad (6)$$

where $y_1, y_2, \ldots$, etc., are the moments of the admittance for node j. Note that the do component $y_0$ is zero since it has been assumed that there is no do path to ground. The three components of the pi-model, i.e., $R_{dj}, C_{fj}$ and $C_{nj}$, are given by:

$$R_{dj} = [[-y^2{}_{3j}/y^3{}_{2j}]] - (y_{3j})^2/(y_{2j})^3,$$

$$C_{fj} = y^2{}_{2j}/y_{3j}, \text{ and}$$

$$C_{nj} = y_{ij} - C_{fj}.$$

For a detailed example for computing the components of the pi-model, see P. R. O'Brien, et al., "Modeling the Driving point Characteristic of Resistive Interconnect for Accurate Delay Estimation," IEEE/ACM ICCAD, 1989, pp.

Figure 1C:
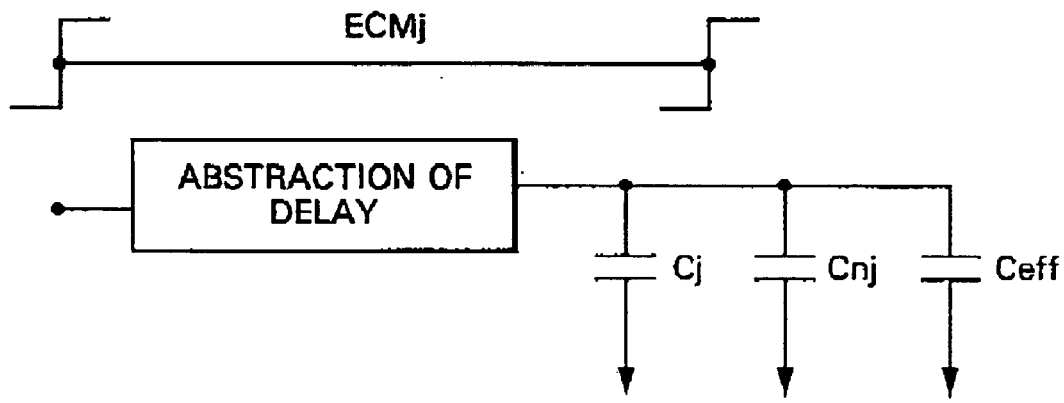
FIG. 1C illustrates estimation of a delay at a node utilizing the present invention.

512–515, which is herein incorporated in its entirety by reference. Following the determination of the components of the pi-model that captures the downstream load, the single RC circuit of resistance $R_{dj}$ and $C_{fj}$ (illustrated in FIG. 1B) is modeled by a single effective capacitance $C_{eff}$ (where $C_{eff}<C_{fj}$) as depicted in FIG. 1C. The ECM delay model of the present invention is thus given by:

$$ECM_j = ECM_{p(j)} + R_j(C_j + C_{nj} + C_{eff}) \quad (7)$$

where $$C_{eff} = C_{fj}(1 - e^{-T/\tau dj}) = C_{fj}(k) \quad (8)$$

The value $\tau dj$ in equation (8) is a time constant equal to $R_{dj}C_{fj}$. It should be noted that $C_{eff}$ depends on the time up to which a charge is matched as well as with the resistance. Thus, if $T=\infty$ or $R_{dj}=0$, then $C_{eff}=C_{fj}$ as expected. Similarly, $C_{eff}=0$ when $R_{dj}=\infty$ or $T=0$. Furthermore, $0 \leq k \leq 1$ is always satisfied. The optimal value of T in equation (8) will be the actual real delay to node j. However, by utilizing the upper bound $T=ED_j$ (Elmore delay at node j), which is the most reasonable pessimistic choice for T, a conservative safety margin is built into the computation of $C_{eff}$ to take into account the waveshape effects. It should be noted that the computation of $C_{eff}$ in equation (8) is based on a step input function. Extending the computation of $C_{eff}$ of the present invention to ramp inputs results in the following equation:

$$C_{eff} = C_{fj}(1 - e^{-(T+\tau/2)/\tau dj}) \quad (8a)$$

Combining equations (7) and (8) results in the complete recursive definition for the effective capacitance metric (ECM) delay model of the present invention:

$$ECM_j = ECM_{p(j)} + R_j(C_j + C_{nj} + C_{fj}(1 - e^{-T/\tau dj})) \quad (9)$$

Figure 2:
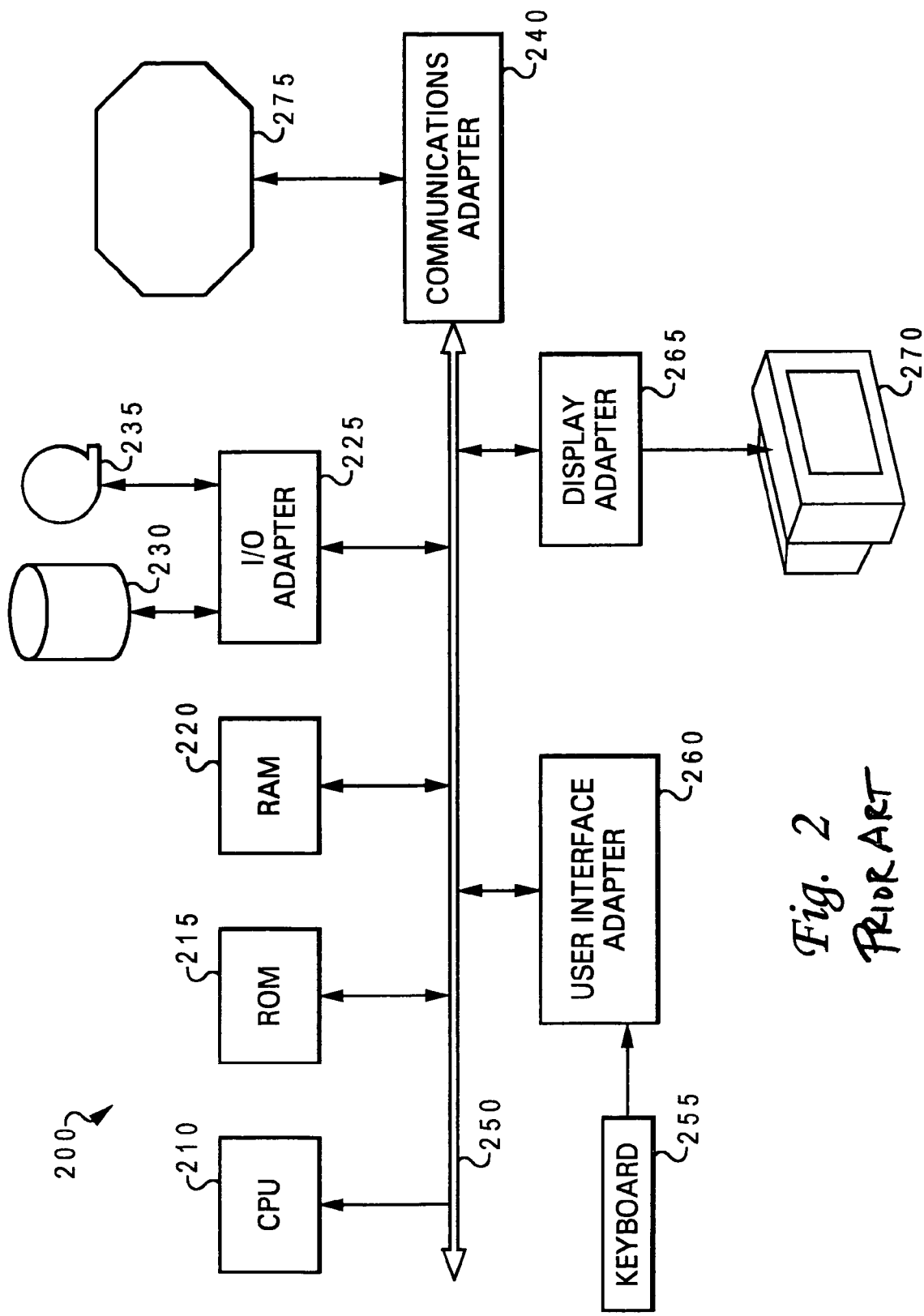
FIG. 2 illustrates an exemplary data processing system that provides a suitable environment for the practice of the present invention.

In a preferred embodiment, the ECM delay model disclosed by the present invention is implemented as a computer executable software program utilized as part of a timing analysis tool, such as International Business Machines (IBM) EinsTimer™. As depicted in FIG. 2, the present invention may be implemented within an exemplary data processing system 200. Data processing system 200 illustrates a typical hardware configuration of a computer workstation platform, such as IBM's RS/6000, that includes a central processing unit (CPU) 210 coupled to a number of devices via a system bus 250.

Data processing system 200 also includes a random access memory (RAM) 220, read only memory (ROM) 215 and input/output (I/O) adapter 225 for connecting peripheral devices, such as disk units 230 and tape units 235 to system bus 250. A user interface adapter 260 is utilized to connect a keyboard device 255 and a mouse (not shown) to system bus 250 while a display adapter 265 couples a display device 270, such as a monitor, to system bus 250. A communication adapter 240 is also depicted for coupling data processing system 200 to an external network, generally designated 275.

It should be noted that although the present invention has been described, in one embodiment, in the context of a computer workstation, those skilled in the art will readily appreciate that the present invention described hereinabove may be implemented, for example, by operating central processing unit 210 or other suitable electronic module to execute a corresponding sequence of machine-readable instructions. These instructions may reside in various types of signal-bearing media. In this respect, one aspect of the present invention concerns a programmed product, that includes signal-bearing media tangibly embodying a program of machine-readable instructions executable by a digital data processor to perform the computation of delays utilizing the ECM delay model described above. The present invention does not contemplate limiting its practice to any particular type of signal-bearing media, i.e., computer readable medium, utilized to actually carry out the distribution. Examples of signal-bearing media includes recordable type media, such as floppy disks and hard disk drives, and transmission type media such as digital and analog communication links and wireless.

Figure 3:
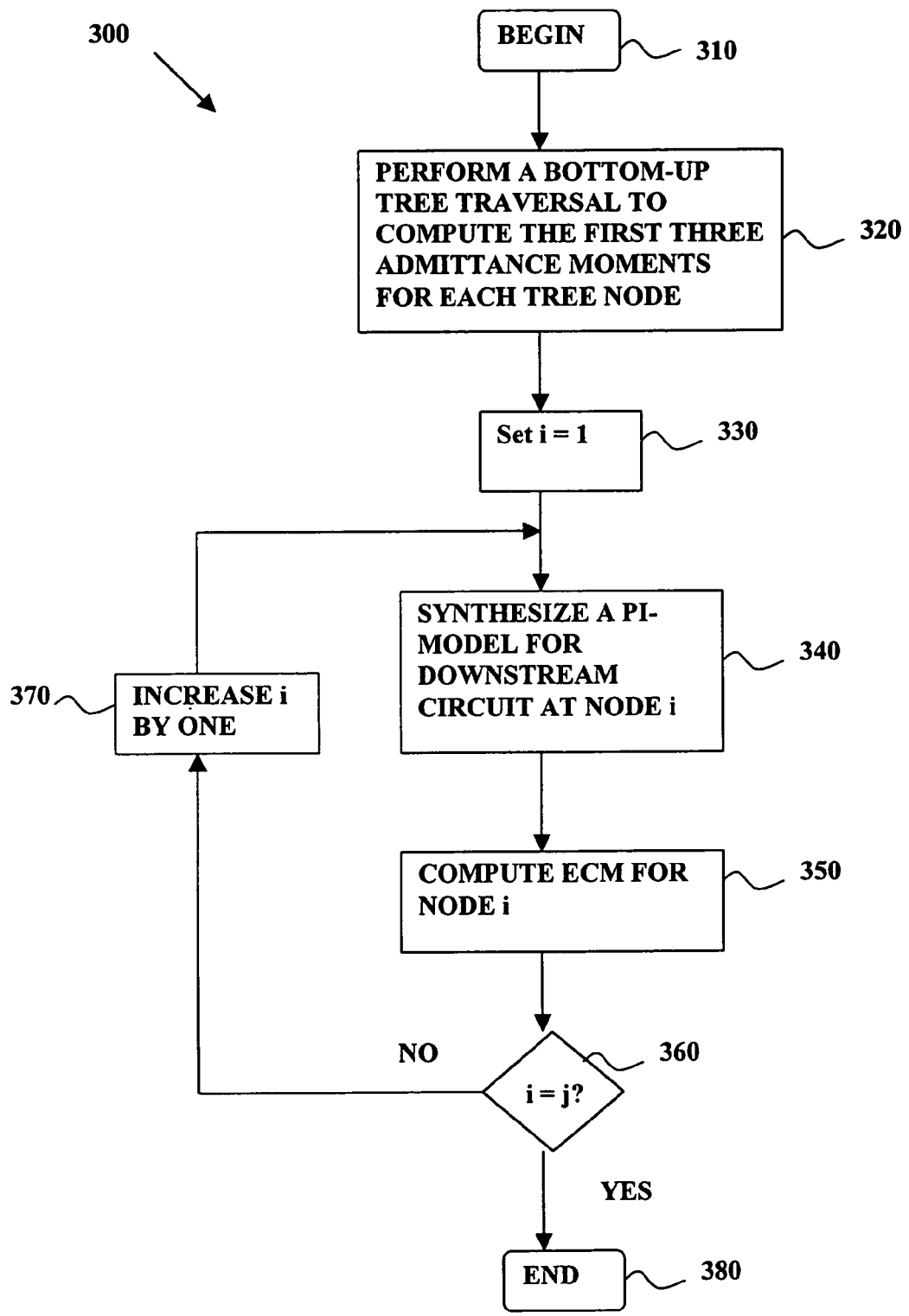
FIG. 3 illustrates a high-level process flow for determining a timing delay at a node j within an interconnect having a number of nodes.
Figure 4A:
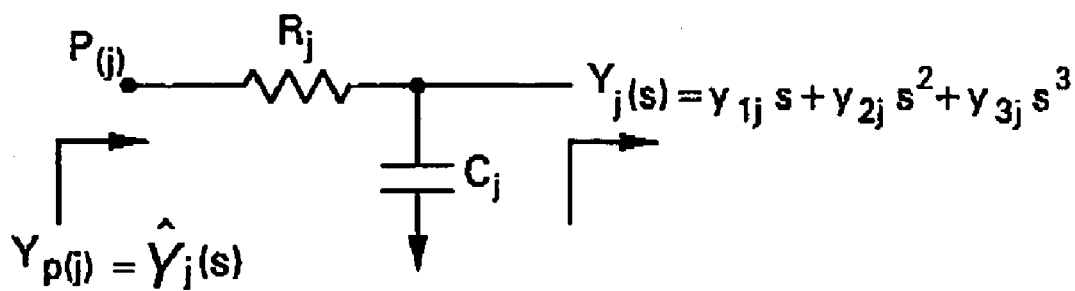
FIG. 4A illustrates a computation of moments across an RC segment.
Figure 4B:
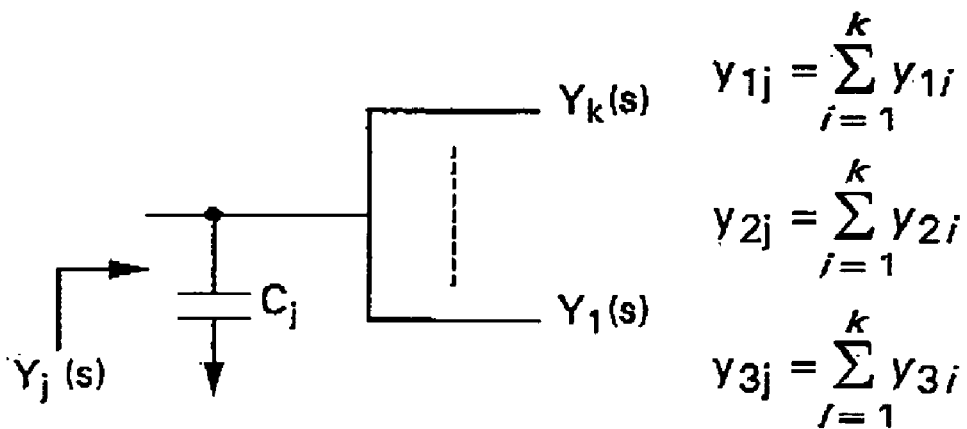
FIG. 4B illustrates combining parallel admittances.

The utilization of the ECM delay model of the present invention will hereinafter be described in greater detail with respect to FIG. 3 that illustrates a high-level process flow 300 for determining a timing delay at a node j within an interconnect having a number of nodes. Process 300 is initiated, as depicted in step 310, when a request is received, for example, from a physical layout verification process, to compute a delay at node j of an interconnect. Next, a bottom-up tree traversal is performed, as illustrated in step 320, to compute, in a preferred embodiment, the first three (3) admittance moments for each tree node. Exemplary methods for the computation of the admittance moments in a bottom-up tree traversal methodology are shown in FIGS. 4A and 4B that illustrate traversing a single RC segment and combining parallel branches, respectively.

Following the computation of the admittance moments, process 300 begins the process of computing the delay at node j by starting at the first near end node by setting, for example, a "counter" to i=one, as depicted in step 330. Next, a pi-model for the downstream circuit seen at node i is synthesize, as illustrated in step 340 and 22—discussed previously. Additionally, the Elmore delay at node i is computed utilizing equation (3). The value of $C_{fi}$ of the pi-model of the downstream circuit seen at node and the Elmore delay, i.e., T, are then utilized to determine the equivalent effective capacitance ($C_{eff}$) seen at node i utilizing equation (8).

After the equivalent effective capacitance has been computed, as depicted in step 350, the delay at node i is then computed using the ECM delay model of the present invention as detailed in equation (9). Following the determination of the delay at node i, process 300 determines if node i is the node for which a delay had been requested for, as illustrated in decisional step 360. In the event that node i is not the requested node, process 300 increases i by one, as depicted in step 370, and delay computation process 300 proceeds to determine the delay for the next node. However, if it is determined that node i is the node under evaluation, i.e., i=j, process 300 ends, as illustrated in step 380, with the computed delay at node j forwarded on to the requesting process.

While the invention has been particularly shown and described with reference to a preferred embodiment, it will be understood by those skilled in the art that various changes in form and detail may be made therein without departing from the spirit and scope of the invention.

What is claimed is:

1. A computer implemented method for utilizing a signal delay model for determining an interconnect delay at a node in an interconnect modeled as a resistive-capacitive (RC) tree having a plurality of nodes, said method comprising:

determining an equivalent effective capacitance value for a downstream load seen at said node, wherein said determining an equivalent effective capacitance includes:

utilizing a pi-model to model said downstream load; and determining an Elmore delay value for said node;

wherein said equivalent effective capacitance (Ceff) is characterized by:

$$Ceff=Cfj(1-e^{-T/\tau dj})$$

wherein Cfj is a far-end capacitance of said pi-model at said node, T is the Elmore delay at said node and τdj is a resistance of said pi-model (Rdj) multiplied by Cfj; and utilizing said equivalent effective capacitance value to calculate said interconnect delay at said node.

2. The method as recited in claim 1, further comprising performing a bottom-up tree traversal to compute the first three admittance moments for each of said plurality of nodes in said interconnect.

3. The method as recited in claim 1, wherein said determining an equivalent effective capacitance value includes determining interconnect delays for nodes in said interconnect preceding said node.

4. The method as recited in claim 1, wherein said utilizing said equivalent effective capacitance value includes calculating said interconnect delay at said node utilizing an effective capacitance metric (ECM) delay model, wherein said ECM delay model is characterized by:

$$ECMj=ECMp(j)+Rj(Cj+Cnj+Cfj(1-e^{-T/\tau dj}))$$

wherein ECMp(j) is a computed ECM delay at a preceding node immediately preceding said node, Rj is a resistance between said node and said preceding node, Cj is a capacitance to ground at said node and Cnj is a near-end capacitance of said pi-model at said node.

5. A data processing system, comprising:
a processor;
means for determining an equivalent effective capacitance value for a downstream load seen at a node in an interconnect modeled as a resistive-capacitive (RC) tree having a plurality of nodes, wherein said determining an equivalent effective capacitance includes:
utilizing a pi-model to model said downstream load; and
determining an Elmore delay value for said node;
wherein said equivalent effective capacitance (Ceff) is characterized by:

$$Ceff=Cfj(1-e^{-T/\tau dj})$$

wherein Cfj is a far-end capacitance of said pi-model at said node, T is the Elmore delay at said node and τdj is a resistance of said pi-model (Rdj) multiplied by Cfj; and
means for utilizing said equivalent effective capacitance value to calculate an interconnect delay at said node.

6. The data processing system as recited in claim 5, further comprising means for performing a bottom-up tree traversal to compute the first three admittance moments for each of said plurality of nodes in said interconnect.

7. The data processing system as recited in claim 5, wherein said means for determining an equivalent effective capacitance value includes means for determining interconnect delays for nodes in said interconnect preceding said node.

8. The data processing system as recited in claim 5, wherein said means for utilizing said equivalent effective capacitance value includes means for calculating said interconnect delay at said node utilizing an effective capacitance metric (ECM) delay model, wherein said ECM delay model is characterized by:

$$ECMj=ECMp(j)+Rj(Cj+Cnj+Cfj(1-e^{-T/\tau dj}))$$

wherein ECMp(j) is a computed ECM delay at a preceding node immediately preceding said node, Rj is a resistance between said node and said preceding node, Cj is a capacitance to ground at said node and Cnj is a near-end capacitance of said pi-model at said node.

9. A computer program product, comprising:
a computer-readable medium having stored thereon computer executable instructions for implementing a method for determining an interconnect delay at a node in an interconnect modeled as a resistive-capacitive (RC) tree having a plurality of nodes, said computer executable instructions when executed perform the steps of:
determining an equivalent effective capacitance value for a downstream load seen at said node, wherein said determining an equivalent effective capacitance includes:
utilizing a pi-model to model said downstream load; and
determining an Elmore delay value for said node;
wherein said equivalent effective capacitance (Ceff) is characterized by:

$$Ceff=Cfj(1-e^{-T/\tau dj})$$

wherein Cfj is a far-end capacitance of said pi-model at said node, T is the Elmore delay at said node and τdj is a resistance of said pi-model (Rdj) multiplied by Cfj; and
utilizing said equivalent effective capacitance value to calculate said interconnect delay at said node.

10. The computer program product as recited in claim 9, further comprising performing a bottom-up tree traversal to compute the first three admittance moments for each of said plurality of nodes in said interconnect.

11. The computer program product as recited in claim 9, wherein said determining an equivalent effective capacitance value includes determining interconnect delays for nodes in said interconnect preceding said node.

12. The computer program product as recited in claim 9, wherein said utilizing said equivalent effective capacitance value includes calculating said interconnect delay at said node utilizing an effective capacitance metric (ECM) delay model, wherein said ECM delay model is characterized by:

$$ECMj=ECMp(j)+Rj(Cj+Cnj+Cfj(1-e^{-T/\tau dj}))$$

wherein ECMp(j) is a computed ECM delay at a preceding node immediately preceding said node, Rj is a resistance between said node and said preceding node, Cj is a capacitance to ground at said node and Cnj is a near-end capacitance of said pi-model at said node.

13. A program product comprising a computer-readable medium including program code for implementing a method for determining an interconnect delay at a node in an interconnect modeled as a resistive-capacitive (RC) tree having a plurality of nodes, where said program code causes a data processing system to perform the steps of:
determining an equivalent effective capacitance value for a downstream load seen at said node, wherein said determining includes determining interconnect delays for nodes in said interconnect preceding said node;
utilizing said equivalent effective capacitance value to calculate said interconnect delay at said node, wherein said equivalent effective capacitance (Ceff) is characterized by:

$$Ceff=Cfj(1-e^{-T/\tau dj})$$

wherein Cfj is a far-end capacitance of a pi-model at said node to model said downstream load, T is an Elmore delay at said node and τdj is a resistance of said pi-model (Rdj) multiplied by Cfj.

14. The program product of claim 13, wherein utilizing said equivalent effective capacitance, value to calculate said interconnect delay includes calculating said interconnect delay at said node utilizing an effective capacitance metric (ECM) delay model, wherein said ECM delay model is characterized by:

$$ECMj = ECMp(j) + Rj(Cj + Cnj + Cfj(1 - e^{-T/\tau dj}))$$

wherein ECMp(j) is a computed ECM delay at a preceding node immediately preceding said node, Rj is a resistance between said node and said preceding node, Cj is a capacitance to ground at said node and Cnj is a near-end capacitance of said pi-model at said node.

* * * * *

UNITED STATES PATENT AND TRADEMARK OFFICE
CERTIFICATE OF CORRECTION

| | |
|---|---|
| PATENT NO. | : 6,968,306 B1 |
| APPLICATION NO. | : 09/668320 |
| DATED | : November 22, 2005 |
| INVENTOR(S) | : Alpert et al. |

It is certified that error appears in the above-identified patent and that said Letters Patent is hereby corrected as shown below:

Col. 6, lines 51-52, insert -- . . . . -- at the end of the equation. --

Signed and Sealed this

Twelfth Day of September, 2006

JON W. DUDAS
*Director of the United States Patent and Trademark Office*